(12) United States Patent
Hayakawa

(10) Patent No.: US 10,879,096 B2
(45) Date of Patent: Dec. 29, 2020

(54) DIE COMPONENT SUPPLY DEVICE

(71) Applicant: FUJI CORPORATION, Chiryu (JP)

(72) Inventor: Masashi Hayakawa, Okazaki (JP)

(73) Assignee: FUJI CORPORATION, Chiryu (JP)

( * ) Notice: Subject to any disclaimer, the term of this patent is extended or adjusted under 35 U.S.C. 154(b) by 0 days.

(21) Appl. No.: 16/462,292

(22) PCT Filed: Dec. 6, 2016

(86) PCT No.: PCT/JP2016/086149
§ 371 (c)(1),
(2) Date: May 20, 2019

(87) PCT Pub. No.: WO2018/105032
PCT Pub. Date: Jun. 14, 2018

(65) Prior Publication Data
US 2019/0355602 A1    Nov. 21, 2019

(51) Int. Cl.
*G01N 21/00*    (2006.01)
*H01L 21/67*    (2006.01)
(Continued)

(52) U.S. Cl.
CPC ... *H01L 21/67288* (2013.01); *G01N 21/9505* (2013.01); *H01L 21/68* (2013.01); *H01L 21/687* (2013.01); *H01L 21/78* (2013.01)

(58) Field of Classification Search
CPC ............ G01N 21/9505; H01L 21/67; H01L 21/67132; H01L 21/67144;
(Continued)

(56) References Cited

U.S. PATENT DOCUMENTS 6,149,047 A    11/2000    Oda

FOREIGN PATENT DOCUMENTS

EP    2 938 176 A1    10/2015
JP    2011-61069 A    3/2011
(Continued)

OTHER PUBLICATIONS

Machine translation of WO 2015/022861, Feb. 2015.*
(Continued)

*Primary Examiner* — Peter B Kim
(74) *Attorney, Agent, or Firm* — Oblon, McClelland, Maier & Neustadt, L.L.P.

(57) ABSTRACT

A die component supply device includes a wafer holding section; a suction nozzle configured to pick up the die components one by one from the component holding sheet; an imaging camera configured to image the die component, which is a pickup target of the suction nozzle, together with the surrounding condition, before being picked up to obtain component image data; a driving section configured to move the suction nozzle and the imaging camera with respect to the wafer holding section; and a data processing memory section configured to collectively store multiple pieces of component image data obtained for each multiple die component or multiple pieces of component characteristic data obtained by performing image processing on the multiple pieces of component image data in wafer characteristic data.

17 Claims, 7 Drawing Sheets

(51) Int. Cl.
*G01N 21/95* (2006.01)
*H01L 21/68* (2006.01)
*H01L 21/687* (2006.01)
*H01L 21/78* (2006.01)

(58) Field of Classification Search
CPC ......... H01L 21/67259; H01L 21/67288; H01L 21/68; H01L 21/681; H01L 21/687; H01L 21/78; H05K 13/043; H05K 13/0813; H05K 13/084
See application file for complete search history.

(56) References Cited

FOREIGN PATENT DOCUMENTS

| WO | WO 2013/145202 A1 | 10/2013 |
| WO | WO 2014/068763 A1 | 5/2014 |
| WO | WO 2015/022861 A1 | 2/2015 |

OTHER PUBLICATIONS

Machine translation of WO 2013/145202, Oct. 2013.*
Extended European Search Report dated Nov. 29, 2019 in Patent Application No. 16923292.3, 7 pages.
International Search Report dated Feb. 21, 2017 in PCT/JP2016/086149 dated Dec. 6, 2016.

* cited by examiner

DIE COMPONENT SUPPLY DEVICE

TECHNICAL FIELD

The present application relates to a die component supply device which supplies a die component formed by dicing a semiconductor wafer.

BACKGROUND ART

Equipment for producing a board on which a large number of components are mounted include a solder printing machine, an electronic component mounter, a reflow machine, a board inspection machine, and the like. In general, a board production line is configured by connecting these equipment. In the equipment described above, the electronic component mounter includes a board conveyance device, a component supply device, a component transfer device, and a control device. One type of component supply device is a die component supply device which holds and supplies multiple die components on an upper face of an elastic component holding sheet. An example of a technology related to the die component supply device is disclosed in Patent Literature 1.

In a method of manufacturing a semiconductor device of Patent Literature 1, first map data having positional information for determining non-defective products or a defective product among multiple semiconductor chips (die components) before being diced is obtained, non-defective semiconductor chips are picked up based on the first map data after being diced, second map data having positional information of remaining semiconductor chips specified by detecting a dicing groove is obtained, and the positional information of the remaining semiconductor chips is specified by collating the first map data and the second map data. With this, defective semiconductor chips can be prevented from being used in production.

PATENT LITERATURE

Patent Literature 1: JP-A-2011-61069

BRIEF SUMMARY

Technical Problem

In the die component supply device, there is a possibility that quality of die components decreases when a suction nozzle picks the die component up. For example, if a component holding sheet in an expanded state is deteriorated or a push-up state by a push-up pot is deteriorated, the die component to be picked up is rubbed against an adjacent die component and chipping may occur. In addition, for example, after a large number of die components are picked up, the component holding sheet extends and hangs down causing the remaining die components to interfere with one another, thereby decreasing the quality. Therefore, in quality control of the die component, it is important to record the state of the die components when the die components are being picked up.

In addition, the technology of Patent Literature 1 prevents a defective die component from being used in production by preventing misrecognition of the die component. The misrecognition of this type of die component is often caused by an uneven expanded state of the component holding sheet. For example, in an initial state, in some cases, expanded states between a central section and a peripheral edge section of the component holding sheet may be different from each other. Further, for example, if the die components held in a two-dimensional lattice shape are picked up in order from an edge, positions of remaining die components may slightly change. Therefore, by recording the state of each die component when the die component is being picked up, misrecognition of the die component is also prevented.

In other words, there are various proposed technologies for determining suitability of a die component to be picked up in real time. However, in a case where a problem occurs later, for example, in a case where a board on which a die component is mounted does not satisfy a specified performance level, it is difficult to trace back to the problem that occurred during pickup and mounting. That is, a traceability function related to die components is not sufficient.

The present disclosure is made in view of the problem described above of the background art, and an object of the present disclosure is to provide a die component supply device having a traceability function related to a die component.

Solution to Problem

The die component supply device disclosed in the present description comprises: a wafer holding section having an elastic component holding sheet which holds multiple die components formed by dicing a semiconductor wafer on an upper face of the component holding sheet and a support ring which supports a peripheral edge of the component holding sheet; a suction nozzle configured to pick up the die components one by one from the component holding sheet; an imaging camera configured to image each die component, together with the surrounding condition before being picked up, to obtain component image data, the die component being a pickup target of the suction nozzle; a driving section configured to move the suction nozzle and the imaging camera with respect to the wafer holding section; and a data processing memory section configured to collectively store, in wafer characteristic data, multiple pieces of the component image data obtained for each of the multiple die components or multiple pieces of component characteristics data obtained by performing image processing on each of the multiple pieces of component image data.

With the die component supply device disclosed in the present description, regarding all die components formed from a single semiconductor wafer and picked up by a suction nozzle, component image data in which the state of the die component when picked up is recorded or component characteristic data in which the state of the die component when picked up is quantified is collectively stored in wafer characteristic data. Therefore, in a case where a problem occurs later, an operator can access the wafer characteristic data to determine the state of the individual die component when picked up, and can further analyze the handling method or the like of the semiconductor wafer. Therefore, the die component supply device has a traceability function that enables a tracing survey to be performed using the wafer characteristic data.

DESCRIPTION OF EMBODIMENTS

1. Configuration of Die Component Supply Device 1 of First Embodiment

Figure 1:
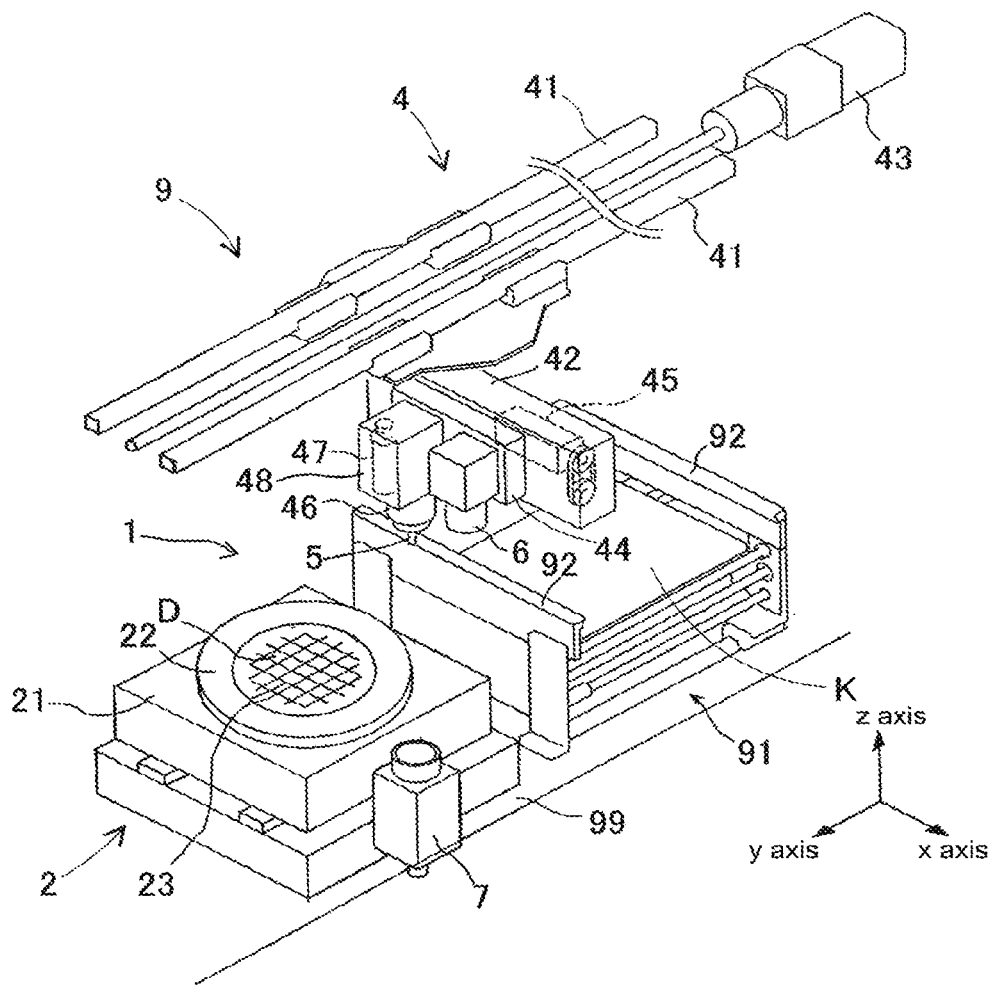
FIG. 1 is a perspective view illustrating a die component supply device according to a first embodiment installed on an electronic component mounter.
Figure 2:
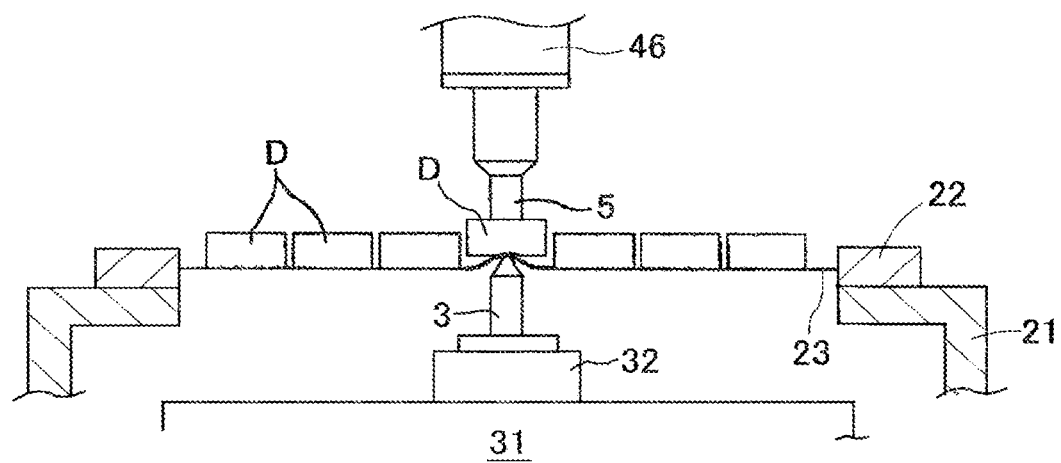
FIG. 2 is a side view illustrating a push-up pot of the die component supply device according to the first embodiment.

Die component supply device 1 according to a first embodiment of the present disclosure will be described with reference to FIGS. 1 to 7. FIG. 1 is a perspective view illustrating die component supply device 1 according to the first embodiment installed on electronic component mounter 9. A direction from the upper left to the lower right in FIG. 1 is an x-axis direction in which board K is conveyed, and a direction from the upper right to the lower left is a y-axis direction which is a front-rear direction of electronic component mounter 9. FIG. 2 is a side view for explaining push-up pot 3 of die component supply device 1 according to the first embodiment. Electronic component mounter 9 is configured to include board conveyance device 91, die component supply device 1, device table 99, and the like. Die component supply device 1 also functions as a component transfer device.

Board conveyance device 91 is configured to include a pair of guide rails 92, a conveyor belt, a clamping device, and the like. The pair of guide rails 92 extend in the x-axis direction across a center of an upper portion of device table 99, and are assembled to device table 99 so as to be parallel to each other. A pair of conveyor belts disposed in parallel with each other are provided side by side immediately below each guide rail 92. The pair of conveyor belts rotate in a state in which board K is placed on a conveyor conveyance surface, and loads and unloads board K to and from a mounting execution position set in a central section of device table 99. In addition, the clamping device is provided below the conveyor belt at the central section of device table 99. The clamping device pushes up board K, clamps board K in a horizontal orientation, and positions board K at the mounting execution position.

Die component supply device 1 is configured to include wafer holding section 2, push-up pot 3, driving section 4, suction nozzle 5, imaging camera 6, part camera 7, control device 8, and the like. Wafer holding section 2 is detachably mounted on a front side of the upper portion of device table 99. Wafer holding section 2 is configured to include wafer table 21, support ring 22, component holding sheet 23, and the like. Wafer table 21 is approximately square and has a thickness in an up-down direction, and has a hole section at a center. Support ring 22 is an annular member, and is mounted around the hole section in the upper portion of wafer table 21 so as to be interchangeable. Support ring 22 supports a peripheral edge of component holding sheet 23. Component holding sheet 23 is formed by using an elastic material. Component holding sheet 23 holds multiple die components D on an upper face of component holding sheet 23.

Multiple die components D are formed by dicing a semiconductor wafer by a dicing device which is an upstream-side device. Multiple die components D are generally disposed in a two-dimensional lattice shape on an upper face of component holding sheet 23, but the present disclosure is not limited thereto. Component holding sheet 23 holding multiple die components D is tensioned by an expanding device, which is an upstream-side device, and is set on support ring 22 in an expanded state.

As illustrated in FIG. 2, push-up pot 3 is provided in a hole section of wafer table 21. Moving mechanism 31 and lifting and lowering mechanism 32 are attached to push-up pot 3. Moving mechanism 31 moves push-up pot 3 to a designated push-up position under component holding sheet 23. The push-up position is designated by x-coordinate value x2 and y-coordinate value y2 of an x-y coordinate system set in wafer holding section 2.

Lifting and lowering mechanism 32 drives push-up pot 3 to be lifted and lowered to push-up height H set for each of die components D. Push-up height H may be set to the same value for all of die components D. Alternatively, multiple values may be used for push-up heights H. For example, different push-up heights H may be set in a region near a center and a region near a peripheral edge of component holding sheet 23. Push-up pot 3 driven upward thrusts up die component D together with component holding sheet 23. Suction nozzle 5 picks push-up die component D up. In FIG. 2, the height of die component D picked up by suction nozzle 5 is a pickup height, and the height of other die components D is a holding height.

Returning to FIG. 1, driving section 4 is configured to include a pair of Y-axis rails 41, Y-axis moving body 42, X-axis moving body 44, and the like. The pair of Y-axis rails 41 are disposed so as to extend from a rear portion of device table 99 to an upper portion of a front portion. Y-axis moving body 42 is loaded on Y-axis rail 41. Y-axis moving body 42 is driven by servomotor 43 via a ball screw mechanism and moves in the y-axis direction. X-axis moving body 44 is loaded on Y-axis moving body 42. X-axis moving body 44 is driven by servomotor 45 via a ball screw mechanism and moves in the x-axis direction.

Mounting head 48 and imaging camera 6 are provided on X-axis moving body 44. Nozzle tool 46 is detachably provided below mounting head 48. Nozzle tool 46 is driven so as to be lifted and lowered by servomotor 47. Suction nozzle 5 is interchangeably mounted below nozzle tool 46. Driving section 4 moves suction nozzle 5 and imaging camera 6 relative to wafer holding section 2. An x-y coordinate system used for controlling driving section 4 coincides with the x-y coordinate system set in wafer holding section 2.

Suction nozzle 5 picks up die components D having a pickup height one by one from component holding sheet 26.

Suction nozzle 5 further mounts the picked up die component D to a designated mounting position of board K. Imaging camera 6 images die component D having a holding height before being picked up together with a surrounding condition to obtain component image data. Imaging camera 6 also has a function of imaging a position mark attached to a surface of board K and grasping a position error of the mounting execution position of board K.

Figure 3:
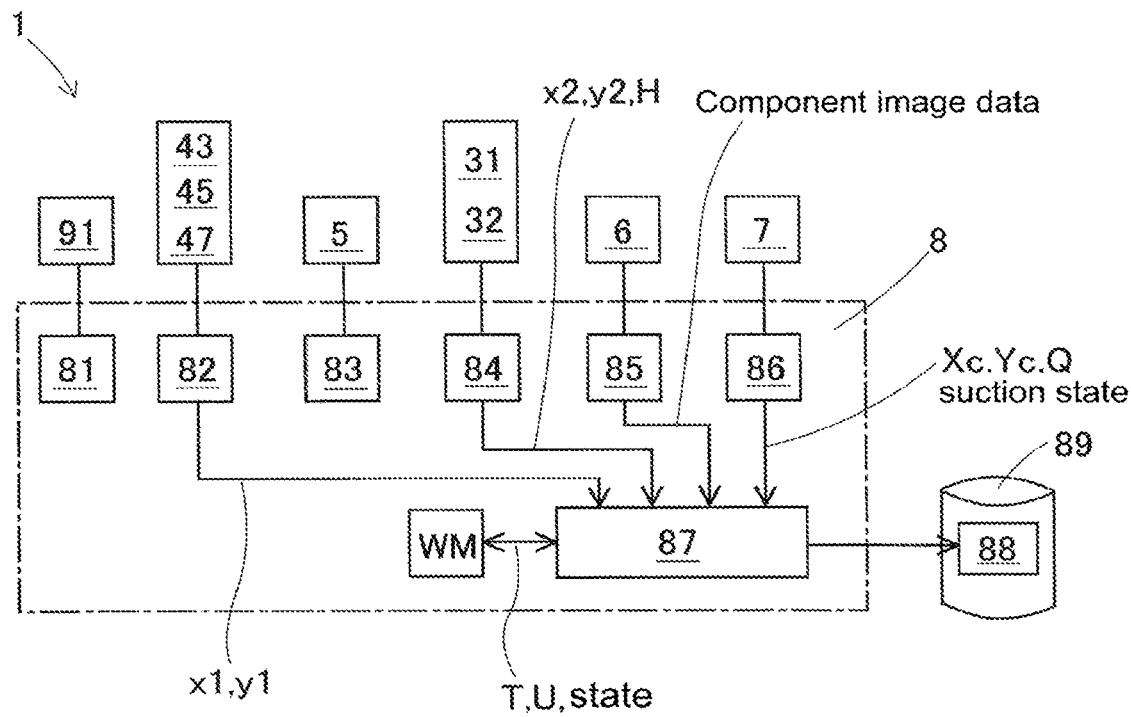
FIG. 3 is a block diagram illustrating a configuration related to control of the die component supply device according to the first embodiment.

Part camera 7 is disposed on the upper portion of device table 99 on a side of wafer holding section 2. Part camera 7 images die component D picked up by suction nozzle 5 from below. In order to perform this imaging, suction nozzle 5 which picks die component D up is temporarily stopped to reach above part camera 7 on the way to board K, or passes above part camera 7 at a constant speed. In the image data obtained by the imaging, rotation angle Q representing a positional deviation and a rotational direction deviation of image-processed die component D is recognized. The positional deviation means a deviation of a center of die component D with respect to a center of suction nozzle 5, and is represented by x-axis direction deviation amount Xc and y-axis direction deviation amount Yc of the x-y coordinate system. As a result, the mounting position at a time of the mounting operation of suction nozzle 5 is finely adjusted. Control device 8 performs overall control of operations of electronic component mounter 9. Control device 8 is configured by a control computer which has a CPU and operates by software. FIG. 3 is a block diagram illustrating a configuration related to control of die component supply device 1 according to the first embodiment. Control device 8 has functions of board conveyance control section 81, driving section control section 82, nozzle control section 83, push-up control section 84, imaging camera control section 85, and part camera control section 86.

Board conveyance control section 81 issues commands to board conveyance device 91 to control loading, positioning, and unloading of board K. Driving section control section 82 controls servomotor 43, servomotor 45, and servomotor 47 of driving section 4 to control a position and a height of suction nozzle 5 in a horizontal direction. Nozzle control section 83 rotationally drives suction nozzle 5. As a result, adjustment of die component D in a mounting direction and compensation of rotation angle Q of die component D are performed. In addition, nozzle control section 83 controls an internal pressure of suction nozzle 5 to control a suction operation and a mounting operation of die component D.

Push-up control section 84 controls moving mechanism 31 and lifting and lowering mechanism 32 to control a push-up position of push-up pot 3, that is, x-coordinate value x2 and y-coordinate value y2, and push-up height H. Imaging camera control section 85 controls an imaging operation of imaging camera 6 and performs image processing of component image data. Part camera control section 86 controls an imaging operation of part camera 7 and performs image processing of image data.

Control device 8 further has a function of data processing memory section 87. Data processing memory section 87 can access wafer map WM corresponding to wafer holding section 2. Data processing memory section 87 performs image processing on multiple pieces of component image data respectively obtained corresponding to multiple die components D to obtain multiple pieces of component characteristic data. Next, data processing memory section 87 collects multiple pieces of component characteristic data in wafer characteristic data 88, and stores wafer characteristic data 88 in storage device 89. Storage device 89 may be either of an internal storage device attached to control device 8 or an external storage device external to electronic component mounter 9. The function of data processing memory section 87 will be described later in detail along with an operation.

2. Disposition Example of Die Components D and Wafer Map WM

Figure 4:
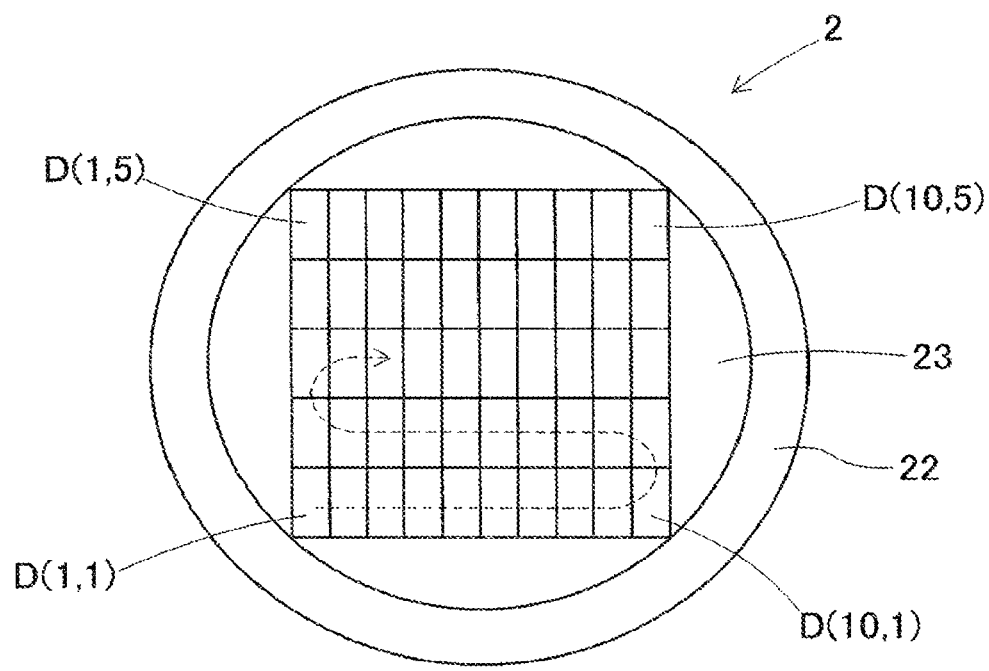
FIG. 4 is a diagram illustrating an example of a disposition of die components on an upper face of a component holding sheet.
Figure 5:
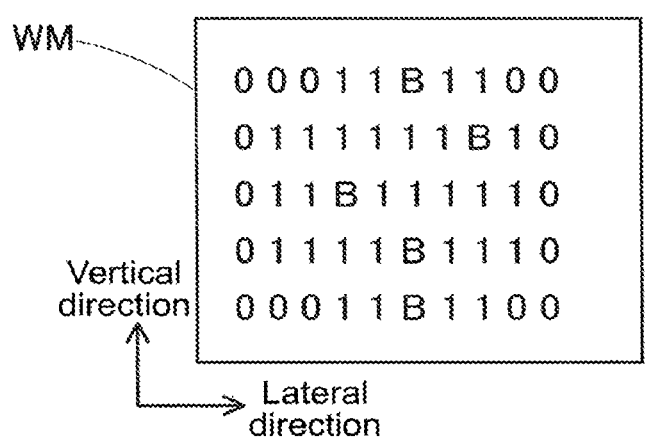
FIG. 5 is a conceptual diagram of a wafer map corresponding to the disposition of the die components illustrated in FIG. 4.

Next, a disposition example of die components D and wafer map WM be described. FIG. 4 is a diagram illustrating an example of disposition of die components D on the upper face of component holding sheet 23. In addition, FIG. 5 is a conceptual diagram of a wafer map corresponding to the disposition of die components D illustrated in FIG. 4. In the example illustrated in FIGS. 4 and 5, ten die components D are disposed in a lateral direction and five die components D are disposed in a vertical direction, so a total number of die components D is 50. Each of die components D is represented as die component D (T, U) in which lateral address T in the lateral direction and vertical address U in the vertical direction counted from the lower left side in the drawing are bracketed. For example, die component D (1, 1) represents the die in the lower left corner, die component D (10, 1) the die in the lower right corner, die component D (1, 5) the die in the upper left corner, and die component D (10, 5) the die in the upper right corner. When wafer holding section 2 is mounted on the upper portion of device table 99, a lateral direction coincides with the x-axis direction, and a vertical direction coincides with the y-axis direction.

Wafer map WM represents disposition of multiple die components D on the upper face of component holding sheet 23. Wafer map WM is generated by a die component inspection device which is an upstream-side device. Generated wafer map WM is transmitted to control device 8 by using a communication device or a portable storage device. An identification code (not illustrated) is given to both wafer map WM and wafer holding section 2. A correspondence relationship between wafer map WM and actual die component D of wafer holding section 2 is ensured by collating the identification code.

In wafer map WM, symbols representing states of 50 die components D are arranged. Both of the symbol of "0" and the symbol of "1" represent non-defective products and indicate that there is a difference in characteristics. The symbol of "B" represents a defective product, and means that the defective product is left on component holding sheet 23 without being picked up by suction nozzle 5. In the example of FIG. 5, die component D (6, 1), die component D (6, 2), die component D (4, 3), die component D (8, 4), and die component D (6, 5) are defective. If die component D is missing and does not exist, the symbol of "N" is used.

The order in which multiple die components D are picked up is predetermined, for example, as illustrated by the broken line arrow in FIG. 4. In the example of FIG. 4, die component D (1, 1) in the lower left corner is first picked up, and then die components D are picked up in order to the right. After die component D (10, 1) in the lower right corner is picked up, die component D (10, 2) is picked up by moving in the vertical direction. Next, die component D (9, 2) is picked up, and die components D are picked up to the left in order. After die component D (1, 2) is picked up, die component D (1, 3) is picked up by moving in a vertical direction. Next, die component D (2, 3) is picked up and die components D are picked up to the right in order. Hereinafter, a U-turn is repeated at both ends in the lateral direction, and finally die component D (10, 5) in the upper right corner is picked up. Defective die components D are not picked up and remain on the upper face of component holding sheet 23.

Figure 6:
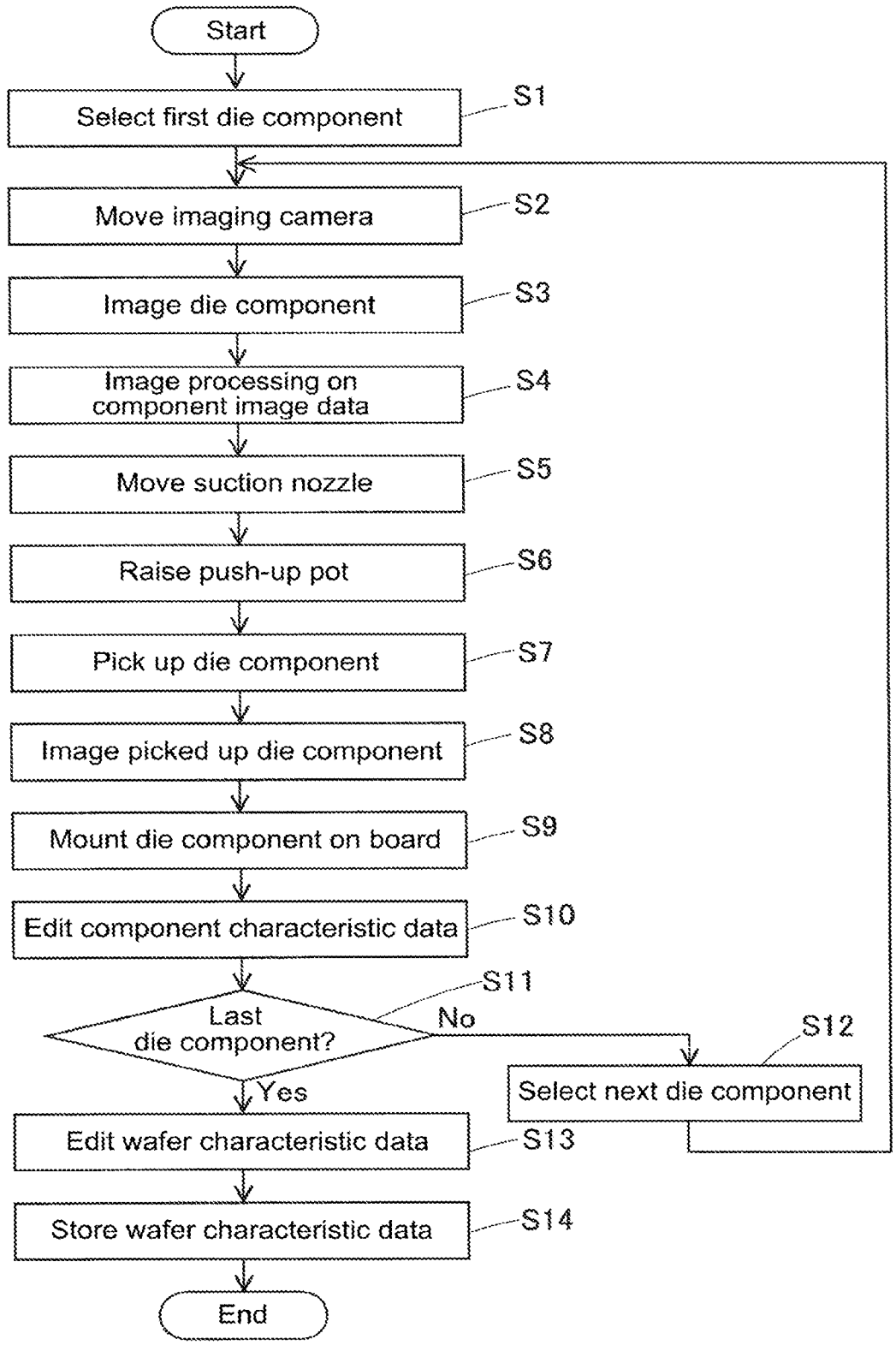
FIG. 6 is a flowchart illustrating a control flow of a control device including a data processing memory section.

3. Operation and Action of Die Component Supply Device 1 of First Embodiment Next, an operation and an action of die component supply device 1 according to the first embodiment including the function of data processing memory section 87 will be described. FIG. 6 is a flowchart illustrating a control flow of control device 8 including data processing memory section 87. When wafer holding section 2 is mounted on the upper portion of device table 99 and board conveyance device 91 positions board K at the mounting execution position, control device 8 starts the control flow. In step S1, control device 8 selects first die component D (1, 1).

In step S2, driving section control section 82 moves imaging camera 6 above wafer holding section 2 to match optical axis P1 of imaging camera 6 (see FIG. 7) with an ideal position of die component D. The ideal position means a position at which center C of die component D is expected to exist. The ideal position is calculated in advance based on, for example, a size of die component D and a dicing width (a cutting width of a dicing saw) set in the dicing device. Alternatively, the ideal position may be an average value of actual positions in a use record in the past of the same type of semiconductor wafers. Driving section control section 82 transmits x-coordinate value x1 and y-coordinate value y1 (see FIG. 7) of optical axis P1 of imaging camera 6 at this time to data processing memory section 87.

In step S3, imaging camera control section 85 images die component D by using imaging camera 6 to obtain component image data. At this time, since push-up pot 3 is descending, imaging camera 6 images die component D having a holding height together with a surrounding condition. Next, in step S4, imaging camera control section 85 performs image processing on the component image data to obtain an actual position of die component D. The actual position of die component D is used for control in next steps S5 and S6. In addition, imaging camera control section 85 transmits the component image data to data processing memory section 87.

In step S5, driving section control section 82 moves suction nozzle 5 above the actual position of die component D. Next, in step S6, push-up control section 84 controls moving mechanism 31 to move push-up pot 3 below the actual position of die component D. Subsequently, push-up control section 84 controls lifting and lowering mechanism 32 to raise push-up pot 3. As a result, die component D rises to the pickup height. Push-up control section 84 transmits x-coordinate value x2 and y-coordinate value y2 of the push-up position at this time and push-up height H to data processing memory section 87.

In step S7, driving section control section 82 lowers suction nozzle 5. Subsequently, nozzle control section 83 controls suction nozzle 5 with a negative pressure. As a result, suction nozzle 5 picks up die component having the pickup height.

In step S8, driving section control section 82 raises suction nozzle 5 on which die component D is picked up, and moves suction nozzle 5 above part camera 7. Subsequently, part camera control section 86 uses part camera 7 to image die component D picked up by suction nozzle 5 from below and obtain captured image data. Part camera control section 86 further performs image processing on the image data to obtain x-axis direction deviation amount Xc, y-axis direction deviation amount Yc, and rotation angle Q.

Part camera control section 86 determines a suction state of die component with reference to the obtained amounts. As the suction state, "good" is a state in which die component D may be mounted on board K, and "discard" is a state in which die component D cannot be mounted on the board. In addition, "error" when imaging fails or when image processing is not performed is also one of the suction states. In many cases, the suction state is "good", and obtained x-axis direction deviation amount Xc and y-axis direction deviation amount Yc, and rotation angle Q are used for control of next step S9. In addition, driving section control section 82 transmits x-axis direction deviation amount Xc, y-axis direction deviation amount Yc, rotation angle Q, and the suction state to data processing memory section 87.

Figure 7:
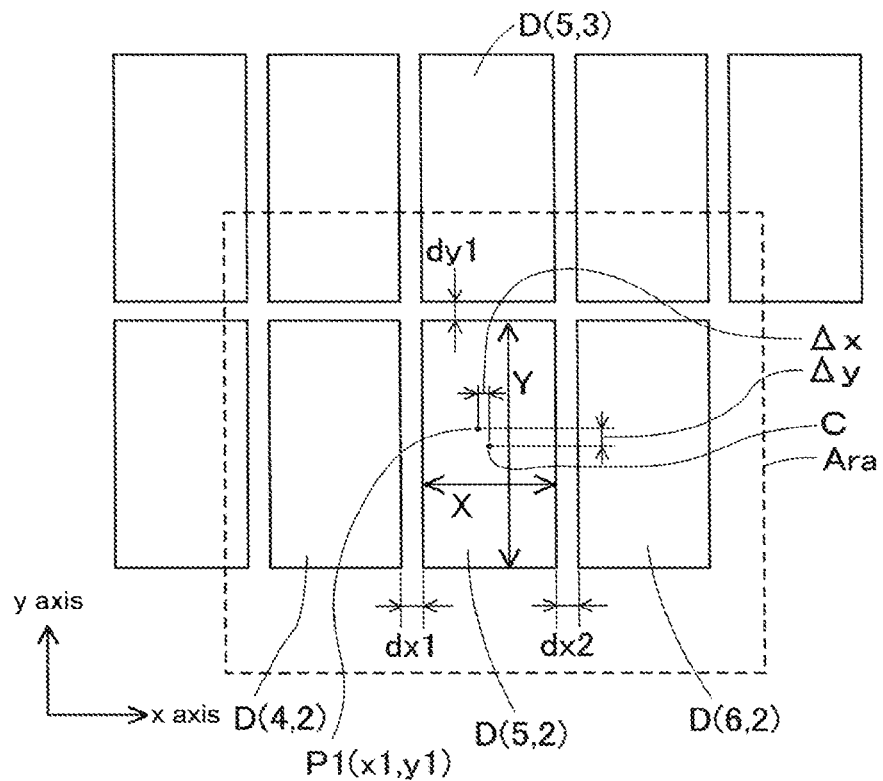
FIG. 7 is a schematic diagram illustrating content of image processing which the data processing memory section performs on component image data.

In step S10, data processing memory section 87 edits the component characteristic data while referring to wafer map WM in addition to the received pieces of data. First, data processing memory section 87 performs image processing on the component image data received from imaging camera control section 85. FIG. 7 is a diagram for schematically explaining contents of image processing which data processing memory section 87 performs on component image data.

FIG. 7 illustrates a state immediately before die component D (5, 2) is picked up. That is, imaging of die component D (5, 2) is performed in a state in which die component D (1, 1) to die component D (7, 2) are already picked up and missing and the defective die component D (6, 2) remains. In FIG. 7, imaging region Ara of imaging camera 6 is indicated by a broken line. Further, x-coordinate value x1 and y-coordinate value y1 of optical axis P1 of imaging camera 6 are illustrated.

First, in the image processing, data processing memory section 87 obtains a size of die component D (5, 2), that is, lateral dimension X and vertical dimension Y. Second, data processing memory section 87 obtains an actual position of center C of die component D (5, 2). Third, data processing memory section 87 obtains a difference amount of the actual position of center C with respect to an ideal position (a position of optical axis P1) of die component D (5, 2), that is, x difference amount Δx and y difference amount Δy.

In addition, data processing memory section 87 obtains a separation distance between adjacent die components D. In the example in FIG. 7, separation distance dx1 between die component D (5, 2) and die component D (4, 2) on the left side of die component D (5, 2) is obtained. In addition, separation distance dx2 between die component D (5, 2) and die component D (6, 2) on the right side of die component D (5, 2) is obtained. Further, separation distance dy1 between die component D (5, 2) and one die component D (5, 3) in a vertical direction of die component D (5, 2) is obtained. In addition, since die component D (5, 1) does not exist, a separation distance between die component D (5, 2) and the other die component D (5, 1) in the vertical direction of die component (5, 2) is not obtained. There are a maximum of four separation distances, and the required number of separation distances varies depending on the surrounding condition of die component D.

Instead of the separation distance, an error amount with respect to an ideal separation distance may be obtained. The ideal separation distance is set in advance based on, for example, a dicing width set by the dicing device. Furthermore, data processing memory section 87 may obtain a rotation angle of die component D, for example, an angle formed by a long side of rectangular die component D and a Y-axis.

Data processing memory section 87 associates the data obtained by the image processing with the other received data to complete component characteristic data. The component characteristic data is generated for each of picked-up die components D. The component characteristic data includes each of the following pieces of data 1) to 11).

1) Pick-up order of die component D
2) Date and time of pickup of die component D
3) Horizontal address T and vertical address U of die component D
4) Status of die component D (symbols of "0", "1", "B" and "N")
5) Position (x-coordinate value x1 and y-coordinate value y1) of optical axis P1 of imaging camera 6 configured to image die component D
6) Push-up position (x-coordinate value x2 and y-coordinate value y2) and push-up height H of push-up pot 3 which thrusts up die component D
7) Deviation amount (x-axis direction deviation amount Xc and y-axis direction deviation amount Yc) and rotation angle Q of die component D with respect to suction nozzle 5 when part camera 7 images die component D
8) Suction state ("good", "discard", and "error") of die component D when part camera 7 images die component D
9) Size of die component D (lateral dimension X and vertical dimension Y)
10) Difference amount (x difference amount $\Delta x$ and y difference amount $\Delta y$) of an actual position with respect to an ideal position of die component D
11) Separation distance dx1, separation distance dx2, and separation distance dy1 between adjacent die components D Returning to FIG. 6, in step S11, data processing memory section 87 determines whether the generated component characteristic data is related to last die component D (10, 5). In a case where it is not, data processing memory section 87 selects next die component D in step S12. After then, data processing memory section 87 returns execution of the control flow to step S2. In step S12, defective die component D is not selected.

The loop from step S2 to step S12 is repeated until there are no non-defective die components D. In a case of wafer map WM illustrated in FIG. 5, component characteristic data of last die component D (10, 5) is generated in 46th step S10. Therefore, data processing memory section 87 advances the execution of the control flow from step S11 to step S13, and exits the loop. In step S13, data processing memory section 87 performs an editing operation to collect pieces of component characteristic data equal to the number of non-defective die components D in wafer characteristic data 88. In next step S14, data processing memory section 87 stores wafer characteristic data 88 in storage device 89.

Contents of stored wafer characteristic data 88 are accessible at any time. In a case where a problem occurs later, such as a case where board K on which die component D is mounted does not satisfy a specified performance level, an operator accesses wafer characteristic data 88. As a result, the operator can determine the state of the individual die component D when the die component D was picked up. In addition, the operator can grasp information on all of picked-up die components D, that is, information on the entire semiconductor wafer, and can perform a tracing survey of a handling method of the semiconductor wafer and the like. For example, it is possible to analyze whether dicing of the semiconductor wafer was appropriately performed, whether the expanded state of the component holding sheet was appropriate, and the like.

4. Mode and Effect of Die Component Supply Device 1 of First Embodiment

Die component supply device 1 includes: wafer holding section 2 that includes elastic component holding sheet 23 which holds multiple die components D formed by dicing a semiconductor wafer on an upper face and support ring 22 which supports a peripheral edge of component holding sheet 23; suction nozzle 5 that picks die components D up one by one from component holding sheet 23; imaging camera 6 that images die component D, which is a pickup target of the suction nozzle 5, together with the surrounding condition, before being picked up to obtain component image data; driving section 4 that moves suction nozzle 5 and imaging camera 6 with respect to wafer holding section 2; and data processing memory section 87 that collectively stores multiple pieces of component image data obtained for each multiple die component or multiple pieces of component characteristic data obtained by performing image processing on the multiple pieces of component image data in wafer characteristic data 88.

With this, regarding all die components D formed from one semiconductor wafer and picked up by suction nozzle 5, the component image data obtained by recording the state at a time of pickup or the component characteristic data obtained by quantifying the state at the time of pickup is collectively stored in wafer characteristic data 88. Therefore, in a case where a problem occurs later, the operator can access wafer characteristic data 88 to grasp the state when individual die component D was picked up. In addition, the operator can grasp information on the entire semiconductor wafer and analyze the handling method of the semiconductor wafer. Therefore, die component supply device 1 has a traceability function that enables a tracing survey by to be performed using wafer characteristic data 88.

Further, data processing memory section 87 collectively stores multiple pieces of component characteristic data in wafer characteristic data 88, and the component characteristic data includes at least one item among the actual position of die component D, the size (lateral dimension X and vertical dimension Y) of die component D, and the separation distance (separation distance dx1, separation distance dx2, and separation distance dy1) between adjacent die components D, which are represented by using the x-y coordinate system set in wafer holding section 2.

According to this, since it is sufficient to store component characteristic data as compared with a configuration in which the component image data is stored as it is and is used for a tracing survey, a memory use amount of storage device 89 can be saved. In addition, since the position of die component D, the size of die component D, the separation distance of adjacent die components D, and the like, which are important indices in the tracing survey, are obtained and stored, an efficient tracing survey becomes possible.

Further, push-up pot 3 which thrusts up die component D from a holding height to a pickup height together with component holding sheet 23 is further provided, and imaging camera 6 images die component D at the holding height and suction nozzle 5 picks die component D at the pickup height up. According to this, since die component D immediately before being pushed up by push-up pot 3 is imaged individually every time, the state when picking die component D up is accurately grasped.

Further, data processing memory section 87 stores information of at least one of the push-up position (x-coordinate value x2 and y-coordinate value y2) and push-up height H of push-up pot 3 set for each of die components D in association with the component image data or includes the information in the component characteristic data. According to this, the state when thrusting die component D up is stored and can be used for the tracing survey.

Figure 8:
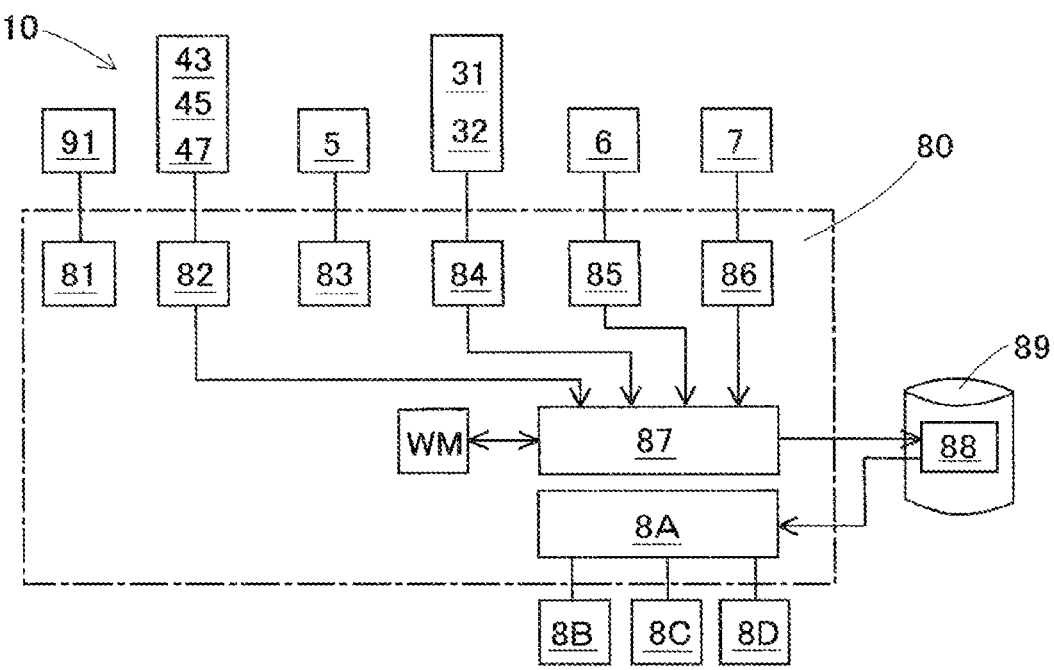
FIG. 8 is a block diagram illustrating a configuration related to control of a die component supply device according to a second embodiment.

5. Configuration, Operation, and Action of Die Component Supply Device 10 of Second Embodiment Next, die component supply device 10 according to a second embodiment will be mainly described with reference to points different from the first embodiment. FIG. 8 is a block diagram illustrating a configuration related to control of die component supply device 10 according to the second embodiment. Control device 80 of the second embodiment has the same function as the first embodiment, and generates and stores wafer characteristic data 88. Control device 80 further has a function of inspection execution section 8A. Inspection execution section 8A may automatically operate when wafer characteristic data 88 is stored, or may operate by a command from an operator.

Inspection execution section 8A executes a predetermined inspection by using stored wafer characteristic data 88. In addition, inspection execution section 8A graphically displays an inspection result of the executed inspection on display device 8B in association with a shape of wafer holding section 2. Further, inspection execution section 8A outputs the inspection result of the executed inspection to at least one of upstream-side device 8C and downstream-side device 8D. As upstream-side device 8C, a dicing device, a die component inspection device, and an expanding device described in the first embodiment can used. In addition, as downstream-side device 80, a board appearance inspection device for inspecting an appearance of board K on which die component D is mounted, and a board performance inspection device for inspecting a performance of board K can used.

Next, a specific example of an inspection executed by inspection execution section 8A will be described. In a first inspection example, inspection execution section 8A compares wafer map WM with wafer characteristic data 88 to inspect whether picked up die component D is suitable. In a simple example, in a case where component characteristic data of die component D (6, 2) determined as a defective product in wafer map WM is included in wafer characteristic data 88, inspection execution section 8A can detect an inappropriate matter of picking up defective die component D (6, 2).

In addition, for example, if die component D (5, 2) is missing during conveyance of wafer holding section 2, die component D (5, 2) is not detected in a vicinity of a center of captured image data. In this case, data processing memory section 87 determines "error" in which die component D (5, 2) cannot be imaged by part camera 7. Data processing memory section 87 records "error" in a field of a suction state of component characteristic data of die component D (5, 2). In addition, fields of a size (lateral dimension X and vertical dimension Y) of the component characteristic data of die component D (5, 2), a difference amount (x difference amount Δx and y difference amount Δy) of the actual position, and the like are blank.

Based on the component characteristic data of die component D (5, 2) in wafer characteristic data 88, inspection execution section 8A can grasp that die component D (5, 2) was not mounted on board K. Further, inspection execution section 8A can grasp a state when picking die component D (4, 2) up based on component characteristic data of die component D (4, 2) to be picked up next. If the state at the time of the pickup is appropriate, inspection execution section 8A can grasp that die component D (4, 2) was mounted on board K. In this manner, inspection execution section 8A can inspect whether misrecognition in which die component D (4, 2) is erroneously recognized as die component D (5, 2) occurs.

Figure 9:
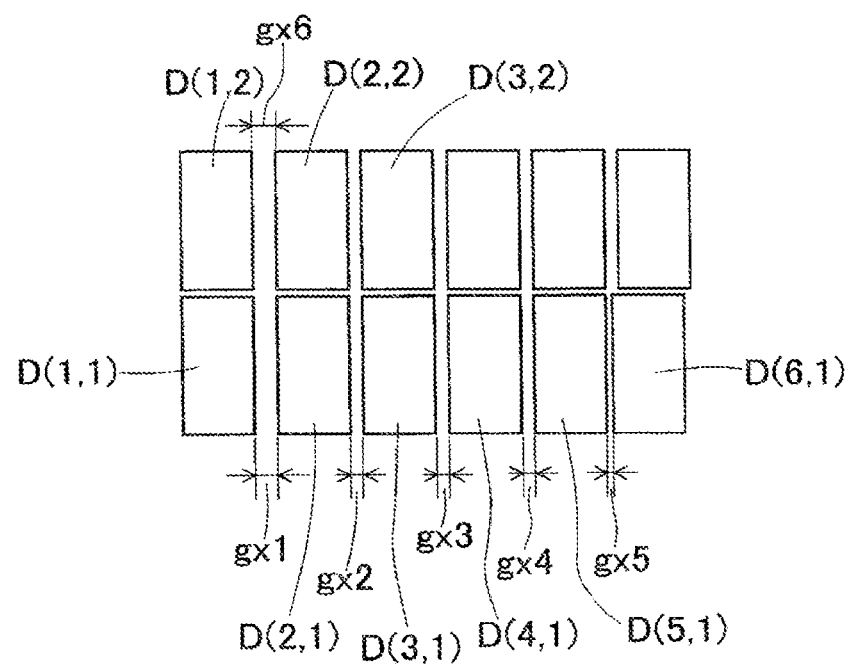
FIG. 9 is a diagram showing a method in which an inspection execution section obtains a separation distance between adjacent die components and performs an inspection.

In a second inspection example, inspection execution section 8A executes inspection to obtain a separation distance between adjacent die components D, based on wafer characteristic data 88. In this inspection, it is possible to inspect a possibility of the picked up die component D being misrecognized, a possibility of die component D being damaged, and whether the expanded state of component holding sheet 23 is acceptable. FIG. 9 is a diagram for explaining a method in which inspection execution section 8A obtains a separation distance between adjacent die components D and performs an inspection.

In FIG. 9, separation distance gx1 is a distance between die component D (1, 1) and die component D (2, 1). Hereinafter, separation distance gx2, separation distance gx3, separation distance gx4, and separation distance gx5 are illustrated in order in a right direction. In addition, separation distance gx6 is a distance between die component D (1, 2) and die component D (2, 2). Inspection execution section 8A can grasp separation distances based on multiple pieces of component characteristic data in wafer characteristic data 88. If separation distance gx1 is greater than lateral dimension X of die component D, inspection execution section 8A can indicate a possibility of misrecognition of die component D. That is, inspection execution section 8A can indicate a possibility that die component D within separation distance gx1 is missing in the middle.

However, there is another possibility that separation distance gx1 is large only because the expanded state of component holding sheet 23 is locally excessive. Inspection execution section 8A refers to separation distance gx6 between die component D (1, 2) and die component D (2, 2) adjacent in the vertical direction to make a determination. In a case where separation distance gx6 is substantially close to an ideal separation distance and is significantly smaller than separation distance gx1, inspection execution section 8A determines that die component D within separation distance gx1 is missing. In addition, in a case where separation distance gx6 is excessively large to the same extent as separation distance gx1, inspection execution section 8A determines that the expanded state is locally excessive.

In addition, separation distance gx5 between die component D (5, 1) and the die component (6, 1) is smaller than separation distance gx2, separation distance gx3, and separation distance gx4. Further, separation distance gx5 is extremely small as compared with the ideal separation distance. This occurs because the expanded state of component holding sheet 23 is too small. If separation distance gx5 is extremely small, die component to be picked up may rub against adjacent die component D, so that there is a risk of causing damage such as chipping. Therefore, inspection execution section 8A can indicate a possibility of die component (5, 1) and the die component (6, 1) being damaged.

Inspection execution section 8A outputs the possibility of die component D (5, 1) being damaged to downstream-side device 8D. As a result, the board appearance inspection device and the board performance inspection device, which are downstream-side device 8D, can carefully inspect board K on which die component D (5, 1) is mounted, and operation accuracy is improved. Since the die component (6, 1) is originally defective and is not mounted on board K, inspection execution section 8A does not output the possibility of the die component (6, 1) being damaged to downstream-side device 8D.

Further, inspection execution section 8A can inspect whether the expanded state of the component holding sheet 23 is acceptable by grasping sizes of separation distance gx1, separation distance gx2, separation distance gx3, separation distance gx4, and separation distance gx5. That is, in a case where each of the separation distances approximates the ideal separation distance and variation is small, the expanded state is determined to be good. Otherwise, the expanded state is determined to have room for improvement.

Inspection execution section 8A outputs an inspection result of the expanded state to the expanding device among upstream-side devices 8C. At this time, not only the result of determining the quality of the expanded state but also information on each of the separation distances is output. As a result, the expanding device can improve the expanding operation of applying tension to component holding sheet 23 with reference to the received information on each of the separation distances.

Figure 10:
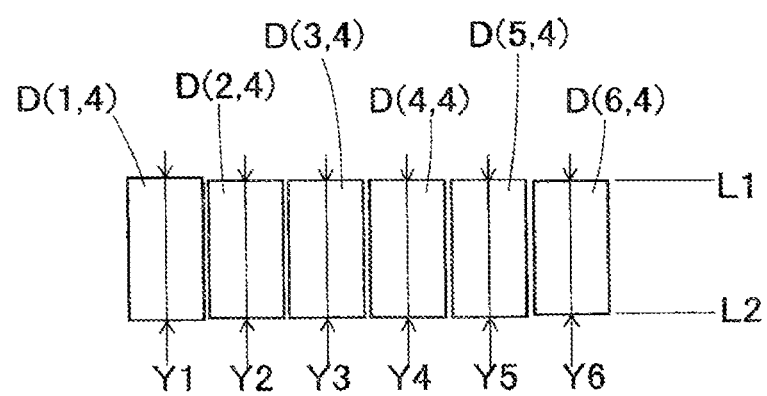
FIG. 10 is a diagram showing a method in which the inspection execution section obtains variations in sizes of multiple die components and performs an inspection.

In a third inspection example, inspection execution section 8A obtains variations in sizes of multiple die components D and inspects the quality the semiconductor wafer in the dicing state, based on wafer characteristic data 88. Inspection execution section 8A performs this inspection even in a case where it is determined that the sizes of individual die component D in the die component inspection device among upstream-side devices 8C are acceptable. FIG. 10 is a diagram for explaining a method in which inspection execution section 8A obtains variations in sizes of multiple die components D and performs an inspection.

In FIG. 10, vertical dimension Y1 of die component D (1, 4) is illustrated. Hereinafter, vertical dimension Y2 of die component D (2, 4), vertical dimension Y3 of die component D (3, 4), vertical dimension Y4 of die component D (4, 4), vertical dimension Y5 of die component D (5, 4), and vertical dimension Y6 of die component D (6, 4) are illustrated in order in the right direction. Here, the vertical dimension becomes smaller in a rightward direction. That is, when expressed by an inequation, a relationship of vertical dimension Y1>vertical dimension Y2>vertical dimension Y3>vertical dimension Y4>vertical dimension Y5>vertical dimension Y6 is established. At this time, inspection execution section 8A can determine that dicing line L1 on the upper side of die component D and dicing line L2 on the lower side of die component D are not parallel to each other and a dicing condition is not good.

Inspection execution section 8A outputs an inspection result indicating that the dicing condition is not good to the dicing device among upstream-side devices 80. At his time, information on dicing line L1 and dicing line L2 is also output. As a result, the dicing device can improve the dicing operation by the dicing saw with reference to the received information.

Figure 11:
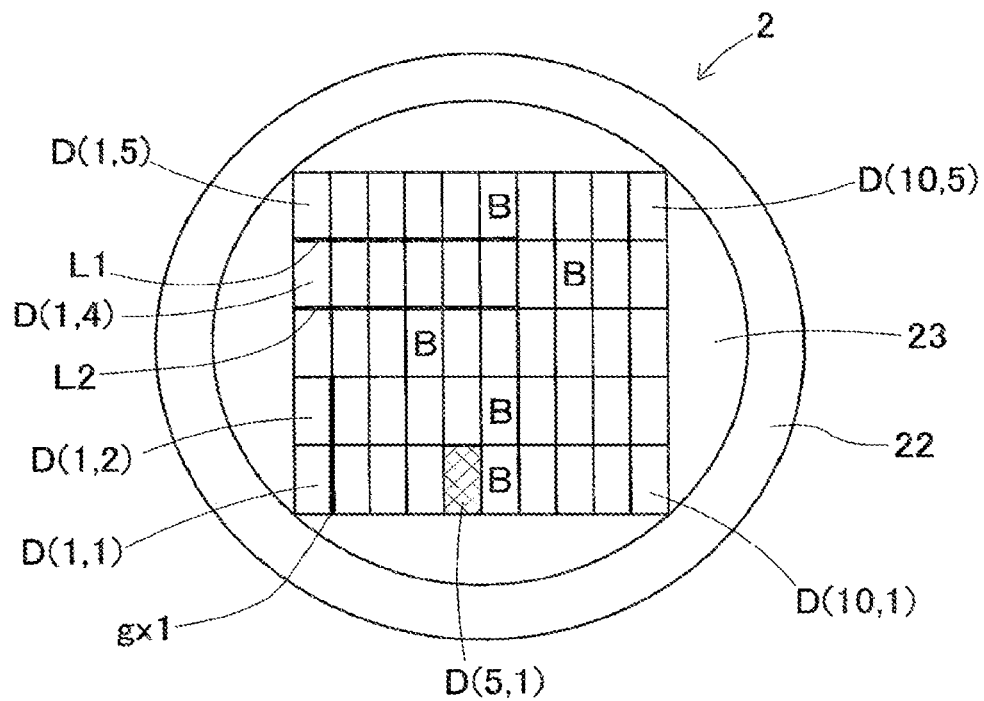
FIG. 11 is an image diagram illustrating a graphical display method of an inspection result in a display device.

Next, a method of graphically displaying an inspection result on display device 8B will be described. FIG. 11 is an image diagram for explaining a graphical display method of an inspection result in display device 8B. In this image diagram, the inspection result described in FIGS. 9 and 10 is graphically displayed on a display screen of display device 8B. Display device 8B graphically displays a shape of wafer holding section 2 as it is, and also displays a symbol of "B" representing a defective product of wafer map WM.

Display device 8B displays large separation distance gx1 and die component D (5, 1) having a possibility of being damaged illustrated in FIG. 9, for easier viewing. In addition, display device 8B displays non-parallel dicing line L1 and dicing line L2 illustrated in FIG. 10 for easier viewing. For display of easier viewing, a method of changing a display color or a display line type, a method of performing blinking display, or the like is appropriately adopted. As a result, it is possible to call attention to an operator and to clearly display a problem portion of an inspection result.

6. Mode and Effect of Die Component Supply Device 10 of Second Embodiment

Die component supply device 10 according to the second embodiment further includes inspection execution section 8A which executes a predetermined inspection by using stored wafer characteristic data 88. According to this, in addition to the inspection of individual die component D, it is possible to execute an inspection related to the entire the semiconductor wafer and to expand inspection items as compared with the related art.

Further, inspection execution section 8A graphically displays the inspection result of the executed inspection in association with the shape of wafer holding section 2. According to this, it is possible to call attention to the operator by using display for easier viewing, and it is possible to clearly display the problem portion of the inspection result.

Further, the inspection execution section outputs the inspection result of the executed inspection to at least one of upstream-side device 8C and downstream-side device 8D. According to this, upstream-side device 8C and downstream-side device 8D can improve operation accuracy or improve an operation with reference to the inspection result.

In addition, inspection execution section 8A compares a wafer map representing disposition of multiple die components D on the upper face of component holding sheet 23 with wafer characteristic data 88 to inspect whether picked up die component D is suitable. According to this, it is possible to inspect an inappropriate matter of picking up defective die component D or misrecognition in which individual die component D is erroneously recognized.

In addition, based on wafer characteristic data 88, inspection execution section 8A obtains the separation distance between adjacent die components D to inspect at least one of the possibility of picked up die component D being misrecognized, the possibility of die component D being damaged, and the quality of component holding sheet 23 in the expanded state. According to this, various inspection items can be executed by obtaining the separation distance between adjacent die components D.

In addition, based on wafer characteristic data 88, inspection execution section 8A obtains variations in the sizes of multiple die components D to inspect the quality of the semiconductor wafer in the dicing state. According to this, it is possible to inspect the quality of the dicing state to which multiple die components D are related, instead of only determining the pass or fail of the size of individual die component D.

7. Application and Modification of Embodiments

Die component supply device 1 according to the first embodiment and die component supply device 10 according to the second embodiment can be implemented in an operation mode without using wafer map WM. In the operation mode without using wafer map WM, a determination result of the quality of die component D is displayed on an upper face of die component D itself and a display is read by image processing of component image data. In addition, in the first embodiment, data processing memory section 87 may collectively store the component image data as it is in wafer characteristic data without performing the image processing. As a result, since the state of the components at the time of pickup is stored in the form of raw data having a large amount of information, it becomes possible to perform predetermined data processing and extraction of a predetermined inspection index which may be desired later.

Further, in the first embodiment, mounting head 48 and imaging camera 6 are provided on common X-axis moving body 44 and move together, but the present disclosure is not limited thereto. That is, mounting head 48 and imaging camera 6 may be provided on each of the different moving bodies, and may be driven in order above die component D so as not to interfere with each other by different driving sections. With this, since imaging camera 6 can image next die component D when mounting head 48 mounts die component D on board K, the required time is shortened. Various other applications and modifications of the present disclosure are possible.

REFERENCE SIGNS LIST

1: die component supply device of first embodiment, 2: wafer holding section, 22: support ring, 23: component holding sheet, 3: push-up pot, 31: moving mechanism, 32: lifting and lowering mechanism, 4: driving section, 5: suction nozzle, 6: imaging camera, 7: part camera, 8: control device, 81: board conveyance control section, 82: driving section control section, 83: nozzle control section, 84: push-up control section, 85: imaging camera control section, 86: part camera control section, 87: data processing memory section, 88: wafer characteristic data, 9: electronic component mounter, 10: die component supply device of second embodiment, 80: control device, 8A: inspection execution section, 8B: display device, 8C: upstream-side device, 8D: downstream-side device, D: die component, WM: wafer map

The invention claimed is:

1. A die component supply device comprising:
    a wafer holding section having an elastic component holding sheet configured to hold multiple die components formed by dicing a semiconductor wafer on an upper face of the component holding sheet and a support ring configured to support a peripheral edge of the component holding sheet;
    a suction nozzle configured to pick up the die components one by one from the component holding sheet;
    an imaging camera configured to image the die component, together with a surrounding condition before being picked up, to obtain component image data, the die component being a pickup target of the suction nozzle;
    a driving section configured to move the suction nozzle and the imaging camera with respect to the wafer holding section; and
    a controller configured to
        perform image processing on multiple pieces of the component image data obtained for each of the multiple die components to obtain multiple pieces of component characteristics data,
        collectively store, in wafer characteristic data, the multiple pieces of component characteristics data, wherein the multiple pieces of component characteristic data includes a size of the die component and a separation distance between the adjacent die components, which are represented by using a coordinate system set in the wafer holding section, and
        access, after a problem with the die component occurs later, the wafer characteristic data to provide a state of the die component when the die component was picked up by the suction nozzle.

2. The die component supply device according to claim 1, wherein the component characteristic data includes a position of the die component.

3. The die component supply device according to claim 1, further comprising;
    a push-up pot configured to push up the die component together with the component holding sheet from a holding height to a pickup height, wherein
    the imaging camera images the die component at the holding height, and
    the suction nozzle picks up the die component at the pickup height.

4. The die component supply device according to claim 3, wherein the controller is configured to store information on at least one of a push-up position and a push-up height of the push-up pot set for each of the die components in association with the component image data, or include the information in the component characteristic data.

5. The die component supply device according to claim 3, wherein the state of the die component when the die component was picked up by the suction nozzle includes a push-up height of the push-up pot when the die component was picked up by the suction nozzle.

6. The die component supply device according to claim 1, wherein the controller is configured to execute a predetermined inspection by using the stored wafer characteristic data.

7. The die component supply device according to claim 6, wherein the controller is configured to graphically display an inspection result of the executed inspection in association with shape of the wafer holding section.

8. The die component supply device according to claim 6, wherein the controller is configured to output an inspection result of the executed inspection to at least one of an upstream-side device and a downstream-side device.

9. The die component supply device according to claim 6, wherein the controller is configured to compare a wafer map representing dispositions of the multiple die components on the upper face of the component holding sheet with the wafer characteristic data to inspect whether the picked up die component is suitable.

10. The die component supply device according to claim 6, wherein the controller is configured to obtain, based on the wafer characteristic data, a separation distance between the adjacent die components to inspect at least one of a possibility of the picked up die component being misrecognized, a possibility of the die component being damaged, and whether an expanded state of the component holding sheet is acceptable.

11. The die component supply device according to claim 6, wherein the controller is configure to obtain, based on the wafer characteristic data, variations in sizes of the multiple die components to inspect whether a dicing state of the semiconductor wafer is acceptable.

12. The die component supply device according to claim 1, wherein the state of the die component when the die component was picked up by the suction nozzle includes a holding height of the die component when the die component was picked up by the suction nozzle.

13. The die component supply device according to claim 1, wherein the problem with the die component occurs later includes a case where a board on which the die component is mounted does not satisfy a specified performance level.

14. An apparatus comprising:
a controller configured to:
perform image processing on multiple pieces of component image data obtained for each of a multiple die components formed by dicing a semiconductor wafer to obtain multiple pieces of component characteristics data;
collectively store, in wafer characteristic data, the multiple pieces of component characteristics data, wherein the multiple pieces of component characteristic data includes a size of the die component and a separation distance between adjacent die components, which are represented by using a coordinate system; and
access, after a problem with the die component occurs later, the wafer characteristic data to provide a state of the die component when the die component was picked up by a suction nozzle.

15. The apparatus according to claim 14, wherein the problem with the die component occurs later includes a case where a board on which the die component is mounted does not satisfy a specified performance level.

16. A method comprising:
performing image processing on multiple pieces of component image data obtained for each of a multiple die components formed by dicing a semiconductor wafer to obtain multiple pieces of component characteristics data; and
collectively storing, in wafer characteristic data, the multiple pieces of component characteristics data, wherein the multiple pieces of component characteristic data includes a size of the die component and a separation distance between adjacent die components, which are represented by using a coordinate system, wherein
a problem with the die component occurs later, and
the method further comprises accessing, after the problem with the die component occurs, the wafer characteristic data to provide a state of the die component when the die component was picked up by a suction nozzle.

17. The method according to claim 16, wherein the problem with the die component occurs later includes a case where a board on which the die component is mounted does not satisfy a specified performance level.

* * * * *